(12) United States Patent
Heppenstall et al.

(10) Patent No.: US 8,742,825 B2
(45) Date of Patent: Jun. 3, 2014

(54) MOSFET WITH TEMPERATURE SENSE FACILITY

(75) Inventors: Keith Heppenstall, Cheshire (GB); Adam Brown, Bramhall (GB); Adrian Koh, Stockport (GB); Ian Kennedy, Cheshire (GB)

(73) Assignee: NXP B.V., Eindhoven (NL)

( * ) Notice: Subject to any disclaimer, the term of this patent is extended or adjusted under 35 U.S.C. 154(b) by 1604 days.

(21) Appl. No.: 11/908,664

(22) PCT Filed: Mar. 14, 2006

(86) PCT No.: PCT/IB2006/050796
§ 371 (c)(1),
(2), (4) Date: Sep. 19, 2008

(87) PCT Pub. No.: WO2006/097896
PCT Pub. Date: Sep. 21, 2006

(65) Prior Publication Data
US 2009/0066404 A1    Mar. 12, 2009

(30) Foreign Application Priority Data

Mar. 15, 2005  (EP) .................................... 05102032

(51) Int. Cl.
*H03K 17/687*  (2006.01)
(52) U.S. Cl.
USPC ........................................................ 327/427

(58) Field of Classification Search
USPC .................................................. 327/427, 434
See application file for complete search history.

(56) References Cited

U.S. PATENT DOCUMENTS

| 4,487,457 A * | 12/1984 | Janutka ................... 327/404 |
| 4,853,563 A * | 8/1989 | Hill et al. ................. 326/83 |
| 5,100,829 A * | 3/1992 | Fay et al. ................. 438/54 |
| 7,492,211 B2 * | 2/2009 | Janssen .................... 327/427 |
| 2003/0197543 A1 * | 10/2003 | Imai ........................ 327/427 |
| 2003/0210507 A1 | 11/2003 | Pihet et al. |

FOREIGN PATENT DOCUMENTS

| EP | 0294882 A2 | 12/1988 |
| EP | 1028526 A2 | 8/2000 |
| JP | 11214691 A | 8/1999 |
| JP | 11214691 | 11/1999 |
| JP | 2002222953 A | 8/2002 |
| JP | 2002222953 | 12/2002 |

\* cited by examiner

*Primary Examiner* — Lincoln Donovan
*Assistant Examiner* — Khareem E Almo

(57) ABSTRACT

A transistor (1) has a FET (2) and a temperature sensing diode (4) integrated within it. Gate drive circuit (12) is arranged to switch off FET (2) and in this case biasing circuit (14) drives a constant current through the diode (4). The voltage across the diode (4) is measured by voltage sensor (15) which provides a measure of the temperature of the FET.

11 Claims, 3 Drawing Sheets

MOSFET WITH TEMPERATURE SENSE FACILITY

This invention relates to a field effect transistor (FET) and in particular to a FET which has a temperature sensing facility.

Field effect transistors (FETs), such as Metal-Oxide Semiconductor FETs (MOSFETs) may incorporate temperature sensing elements to detect temperature fluctuations for purposes of protecting the device or circuit from failure.

Such temperature sensing elements may be integrated on a common substrate so that they can detect the fluctuation of a MOSFET more rapidly. Indeed, the elements may be integrated into the MOSFET. For example, US 2003/0210507 describes a temperature sensor for a MOS circuit configuration implemented as the gate of a MOS transistor, wherein the gate of the transistor is configured as a two-terminal network with a gate input and gate output in such a way that it is possible to determine the temperature at its location by measuring the voltage drop across the gate.

Furthermore, the use of a semiconductor diode as a thermally coupled temperature sensing element is known in the art. U.S. Pat. No. 5,100,829 describes a MOSFET device incorporating a substrate temperature sensing element. By forming a PN junction on a (gate) dielectric region, the thermal response to temperature changes in the substrate is improved while still being electrically isolated from the substrate.

However, such additional temperature sensing terminals can make the MOSFET difficult to integrate into existing circuits. Such MOSFETs require additional circuitry.

According to a first aspect of the invention, there is provided a transistor circuit, comprising:
a field effect transistor device with source, gate and drain;
a temperature sensing diode connected between the gate and source of the FET, the diode cathode connected to the gate of the FET and the diode anode connected to the source of the FET;
a gate drive circuit for the FET arranged to apply a negative bias to the FET gate when the FET is off; and
a sensor connected between the gate and source of each FET to measure a parameter representing the temperature of the FET when the gate drive circuit applies the negative bias.

The gate drive circuit may include a constant current source to create a forward current flow through the diode when the FET is in the off condition. Accordingly, the sensor may include voltage-sensing means to measure the temperature dependent gate-source voltage of the FET, thus determining the FET temperature.

The temperature sensing diode may be within the gate bond pad area of each FET substrate to minimise the need to sacrifice active area.

In an embodiment, the transistor circuit may include a plurality of FETs with temperature sensing diodes connected between the gate and source of each FET, the diode cathode connected to the gate of the FET and the diode anode connected to the source of the FET, wherein a sensor is connected between the gate and source of each FET to measure a parameter representing the temperature of the FET and the gate drive circuit is arranged to apply a negative bias to each FET gate when the respective FET is off.

The transistor circuit may be further arranged such that the FETs are in parallel to drive a circuit load and the gate drive circuit switches off the FETs alternately. In this way, the individual FET gate drives may be 'strobed' so that the temperature of all the FETs can be monitored, while maintaining the overall current flow through the paralleled devices that were still turned on.

The invention also relates to the device itself. According to a second aspect of the invention, there is provided a transistor device, comprising:
a field effect transistor on a substrate with source, gate and drain;
a gate bond pad on a first major surface of the substrate; and
at least one temperature sensing diode under the gate bond pad, the temperature sensing diode being electrically connected between the gate and source of the FET, the or each temperature sensing diode being oriented with the diode cathode connected to the gate of the FET and the diode anode connected to the source of the FET.

By providing the diode under the gate bond pad the active area of the FET is maintained in spite of the presence of the diode.

The diode provides a temperature sensing capability when it is forward biased. By applying a negative bias to the FET gate pin when the FET is in the off condition, a sensor connected between the gate and source of the FET can measure a parameter representing the temperature of the FET.

The temperature sensing diode may be a zener diode. This may also act as an electrostatic discharge (ESD) protection element by providing a path which diverts the charge of a potentially damaging ESD strike away from the sensitive FET device.

The gate bond pad may be located in an area of the MOSFET which is tightly thermally linked to the active area of the FET and with an intimate thermal contact. The thermal inertia of the structure may provide a fast response. One way of achieving this is to provide the gate bond pad in a region on the first major surface surrounded by the FET, so that it is thermally linked on all sides to the FET. This region may also be the region that gets hottest when the FET operates, so that the temperature sensing occurs in the hottest region thereby improving the ability to rapidly detect overheating.

The device may be packaged in a housing having exactly three terminals being the gate terminal, the source terminal and the drain terminal. Such packages are commonly used for power circuits, thus no additional design would be required to implement the transistor device according in existing or new designs.

Prior MOSFET devices with temperature sensing require separate package pins in addition to the standard MOSFET terminals. The invention provides a MOSFET device with a temperature sensing capability that has only three terminals, thereby reducing cost.

According to a third aspect of the invention, there is provided a method of monitoring the temperature of a FET having a temperature sensing diode connected between the gate and source of the FET, the diode cathode being connected to the gate of the FET and the diode anode being connected to the source of the FET, the method comprising:
a. controlling the gate of the FET to turn off the FET;
b. applying a negative bias to the FET gate when the FET is turned off;
c. determining the value of a parameter representing the temperature of the FET with the negative bias applied;
d. controlling the gate of the turned off FET to turn the FET on again.

The method may further include determining whether the FET temperature is above a predetermined target value and if so controlling the gate of the FET to keep the FET switched off until the temperature reduces to the predetermined target value.

In an embodiment, a plurality of FETs may be provided in parallel and the FET gates controlled to switch off the FETs alternately. In addition, devices that are getting disproportionately hot may be 'rested' while maintaining overall current flow.

Presently, to allow for variations between paralleled MOSFETs, excess capacity to allow for worst-case conditions must be included which has extra cost and space implications. Using the integrated temperature sensing feature to realise active thermal balance will allow a cost saving. Such active dissipation allows savings in active area for a constant risk of overheating, or a reduced risk of overheating for a constant active area.

For a better understanding of the invention, embodiments will now be described, purely by way of example, with reference to the accompanying drawings, in which.

Figure 1:
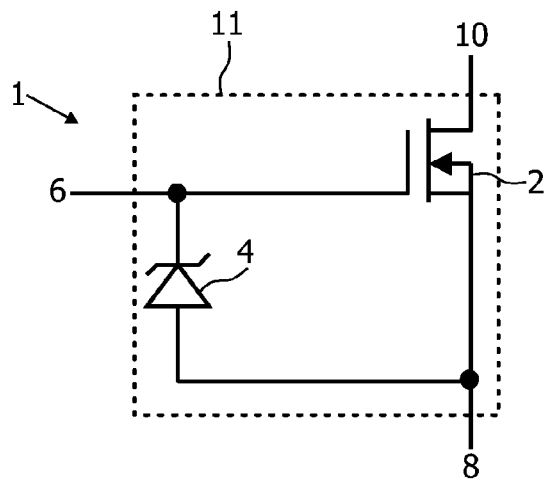
FIG. 1 shows a first embodiment of a transistor device according to the invention.
Figure 2:
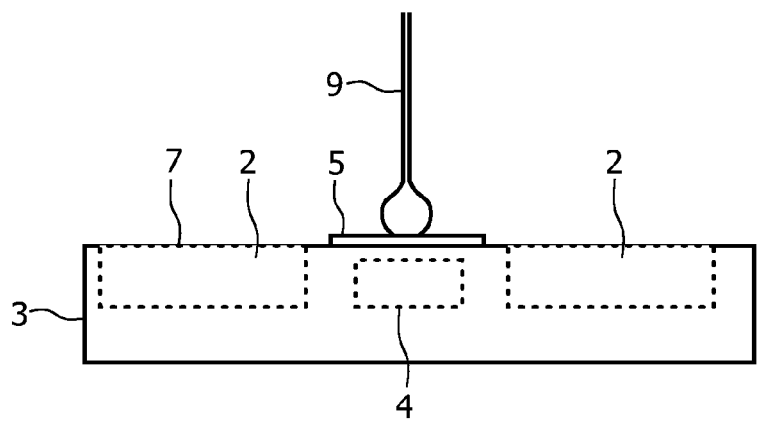
FIG. 2 is a side view of a transistor device of the first embodiment.
Figure 3:
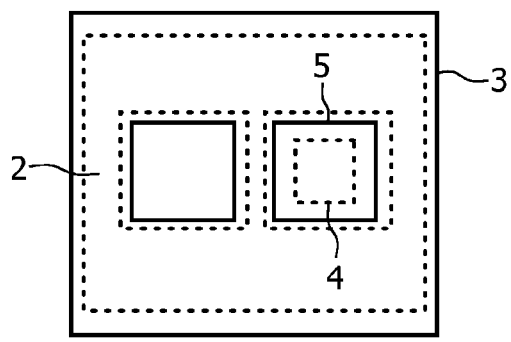
FIG. 3 is a top view of a transistor device of the first embodiment.

Referring to FIGS. 1 to 3, a transistor device 1 with a temperature sense facility is shown schematically in FIG. 1. FIGS. 2 and 3 show the semiconductor substrate in side and top views.

Field effect transistor (FET) 2 transistor regions are provided on the semiconductor substrate 3, the field effect transistor regions 2 defining source, gate and drain regions as is known. Any suitable transistor FET structure may be used, including vertical and horizontal structures.

A zener diode 4 is electrically connected between the gate and source of the FET 2, the diode cathode being connected to the gate of the FET 2 and the diode anode being connected to the source of the FET 2, as shown in FIG. 1.

Although a single diode 4 is shown a plurality of diodes in series all oriented in the same direction may be used instead.

The spatial arrangement is shown in FIGS. 2 and 3, which shows gate bond pad 5 provided on a first major surface 7 of the substrate 3, together with bond wire 9. To minimise the need to sacrifice active area, the temperature sensing zener diode 4 is under gate bond pad 5 of the FET 2. The diode 4 may be formed in polysilicon and be insulated from the FET 2 by conventional semiconductor processing techniques. Since the diode 4 is to be connected between gate and source, its location under the gate bond pad allows its cathode to be conveniently connected to the gate, and the source metal layer may make the anode to source connection.

The gate bond pad is located in a region on the first major surface surrounded by the FET transistor regions 2 for good thermal coupling, as illustrated in FIG. 3. Thus, the region of the zener diode 4, under the gate bond pad 5, may typically have intimate thermal contact with the FET region. The diode structure also preferably has low a thermal inertia. Note that it is not essential for the gate bond pad to be in the centre of the substrate 3. FIG. 3 shows also a further contact, for example for the source of the FET transistor regions.

The zener diode 4 provides a temperature sensing capability when it is forward biased. By causing a constant forward current through the zener diode 4 when the FET 2 is in the off condition, a parameter representing the temperature of the FET sensor connected between the gate and source of the FET can be measured.

In addition, the zener diode 4 can act as an electrostatic discharge (ESD) protection element by providing a path which diverts the charge of a potentially damaging ESD strike away from the sensitive regions of FET 2.

The transistor device 1 may be packaged in a housing 11 (shown schematically in FIG. 1) having exactly three terminals being the gate terminal 6, the source terminal 8 and the drain terminal 10. Such three pin packages are commonly used so no additional work would be required to implement the transistor device in existing or new designs. This is particularly advantageous for high current MOSFETs, since the technique is also applicable to high current packages.

Figure 4:
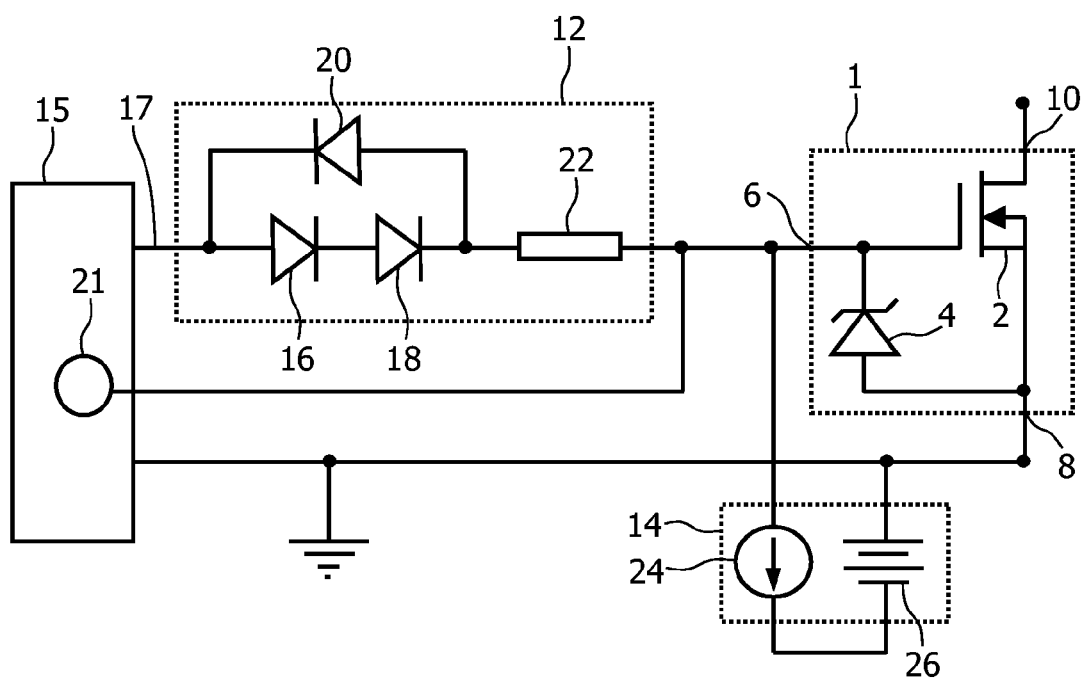
FIG. 4 shows a circuit diagram of a circuit according to a second embodiment of the invention.

Referring to FIG. 4, a circuit diagram of an embodiment of a circuit according to the invention is shown.

The circuit includes a gate drive circuit 12 connected between a controller 15 and the gate terminal 6 of the transistor device 1 and a biasing circuit 14 connected between the gate terminal 6 and source terminal 8 of the transistor device 1. The circuit is then completed with a voltage sensor 21 connected to the gate terminal 6.

The circuit may be arranged as either a low-side or high-side configuration to drive a load, thus, the source terminal 8 may or may not be grounded. In this embodiment, the source terminal 8 is at ground potential and the circuit operates in a low-side drive configuration.

The transistor device 1 is as shown in FIG. 1, i.e. a FET 2 with a zener diode 4 connected between the gate 6 and source 8 of the FET 2, the diode cathode connected to the gate 6 of the FET 2 and the diode anode connected to the source 8 of the FET 2.

The gate drive circuit 12 is connected to receive a gate drive signal from the controller 15 on line 17 and includes a parallel diode network 16,18,20 series connected to the gate terminal 6 through a resistor 22. One branch of the parallel network contains two diodes 16,18 oriented in the same direction (i.e., anode-to-cathode) such that they allow current flow in the direction of the gate terminal 6 through resistor 22. The diode 20 in the other branch is oriented in a direction opposite to the diodes 16,18 in the other branch.

The biasing circuit 14 includes a constant current source 24 and a constant voltage source 26 arranged to apply a negative bias to the FET gate and cause a forward current to flow through the temperature sensing zener diode 4. This circuit is intended to operate when the FET 2 is off.

The biasing circuit 14 and gate drive circuit 12 may be controlled by controller 15, which incorporates within it voltage sensor 21. Alternatively, the biasing circuit 14 may operate permanently, but the gate drive circuit will be arranged to dominate, overwhelming the small current used for temperature sensing.

The forward voltage of a semiconductor diode at a given current is dependent on its temperature. Thus, when the FET 2 is off, the gate-source voltage will be the forward voltage of the gate source diode with the current 24 flowing through it. This voltage is dependent on temperature. By sensing the voltage at the gate terminal 6, the sensor 21 can therefore measure a parameter representing the temperature of the FET.

In use, the FET 2 is held on using the controller via gate drive circuit 12. From time to time, the gate drive from the controller, and hence FET 2, is switched off. Biasing circuit 14 is switched on delivering a constant current through the diode 4. The voltage across the diode is sensed by voltage sensor 21 which provides a measure of the temperature of the FET 2.

After measuring the temperature, a judgment can be made and, if appropriate, the gate drive from the controller 15 may be reinstated and normal operation resumed.

Figure 5:
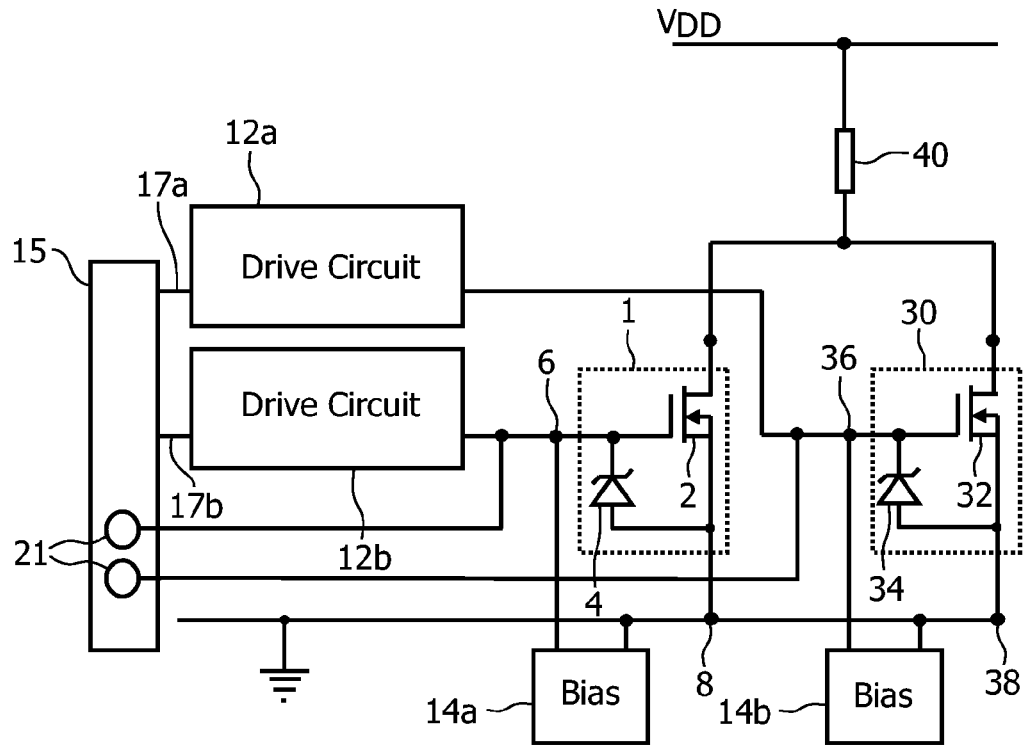
FIG. 5 shows a circuit diagram of a circuit according to a third embodiment of the invention.

An alternative embodiment of a circuit according to the invention is shown in FIG. 5. The transistor circuit includes two transistor devices 1,30 each having temperature sensing diodes 4,34 connected between their respective gates 6,36 and source 8,38, the diode cathode connected to the gate of the FET and the diode anode connected to the source of the FET. The transistor devices 1,30 are arranged in parallel to drive a circuit load 40 and a sensor 21 is connected to the gate terminal 6,36 of each transistor device 1,30 to measure a parameter representing the temperature of each FET 2,32.

Depending upon the configuration required to drive the circuit load 40, source terminals 8,38 may or may not be grounded. In the case shown, with the source terminals 8, 38 grounded, the FETs operate as a low side circuit to drive load 40.

Bias circuits 14*a* and 14*b* for the respective transistor devices 1,30 are each the same as in the arrangement of FIG. 2. Similarly, drive circuits 12*a* and 12*b*, which are connected to receive respective first and second gate drive waveforms 42, 44 from controller 15 on lines 17*a*, 17*b* respectively, have the same arrangements as the gate drive circuit 12 of FIG. 4. Accordingly, the drive circuits 12*a*, 12*b* and bias circuits 14*a*, 14*b* are not shown in detail in the drawing.

Figure 6:
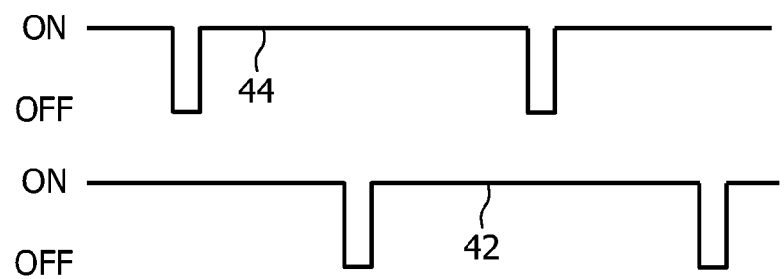
FIG. 6 shows gate drive waveforms for the circuit shown in FIG. 5.

FIG. 6 shows the first gate drive waveform 42 on line 17*a* for the first transistor 1 and the second gate drive waveform 44 on line 17*b* for the second transistor 30 as a function of time. It may be seen that the output of gate drive circuits 12*a*, 12*b* of FIG. 5 switch off the FETs 2,32 alternately. When a FET is off, its temperature may be measured by the respective sensor 21 (FIG. 5).

By arranging the gate drive circuits to switch off the FETs 2,32 alternately, the temperatures of the FETs 2,32 can be monitored while maintaining the overall current flow through the load.

Furthermore, if it is determined that the temperature of any of the FETs 2,32 is above a predetermined target value, then the gate terminal 6,36 of the respective FET 2,32 is controlled to keep the FET 2,32 switched off until its temperature reduces to the predetermined target value. Thus, a device that is getting disproportionately hot can be 'rested' while maintaining overall current flow in the circuit using the other device.

Although FIG. 5 only shows 2 FETs in parallel the invention is applicable to many more FETs being operated in parallel.

The invention is not limited to the embodiments described above and those skilled in the art will be able to design many modifications while retaining the teachings of the invention.

The embodiment of FIG. 5 has the load connected such that the circuit acts as a low-side device. The skilled person will appreciate however that the circuit is equally applicable to drive a load in a high-side drive configuration.

From reading the present disclosure, other variations and modifications will be apparent to the skilled person. Such variations and modifications may involve equivalent and other features which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

The invention claimed is:

1. A transistor device, comprising: a field effect transistor (FET) on a substrate with source, gate and drain; a gate bond pad on a first major surface of the substrate; at least one temperature sensing diode; and a channel between the gate bond pad and the temperature sensing diode, the temperature sensing diode being electrically connected between the gate and source of the FET, the temperature sensing diode being oriented with the diode cathode connected to the gate of the FET and the diode anode connected to the source of the FET.

2. A transistor device according to claim 1 wherein the temperature sensing diode is a zener diode.

3. A transistor device according to claim 1 wherein the gate bond pad is located in a region of the first major surface surrounded by the FET.

4. A transistor circuit, comprising: a transistor device including a field effect transistor (FET) with source, gate and drain and a temperature sensing diode connected between the gate and source of the FET, the diode cathode connected to the gate of the FET and the diode anode connected to the source of the FET; a biasing circuit arranged to apply a negative bias to the FET gate when the FET is off; and a sensor connected between the gate and source of the FET to measure a parameter of the temperature sensing diode, the parameter representing the temperature of the FET when the FET is off.

5. A transistor circuit according to claim 4 wherein the biasing circuit includes a constant current source and the sensor is a voltage sensor.

6. A transistor circuit according to claim 4 wherein the temperature sensing diode is under the gate bond pad of the FET.

7. A transistor circuit according to claim 4 comprising: a plurality of devices each with temperature sensing diodes connected between the gate and source of a respective FET, the diode cathode connected to the gate of the FET and the diode anode connected to the source of the FET; and a sensor connected to the gate of each FET to measure a parameter representing the temperature of the FET wherein the biasing circuit is arranged to apply a negative bias to each FET gate when the respective FET is off.

8. A transistor circuit according to claim 7 wherein the FETs are arranged in parallel to drive a circuit load and a gate drive circuit is arranged to switch off the FETs alternately.

9. A method of monitoring the temperature of a FET having a temperature sensing diode connected between the gate and source of the FET, the diode cathode being connected to the gate of the FET and the diode anode being connected to the source of the FET, the method comprising:
controlling the gate of the FET to turn off the FET;
applying a negative bias to the FET gate when the FET is turned off;
determining a value of a parameter of the temperature sensing diode, the value representing the temperature of the FET when the FET is off; and controlling the gate of the turned off FET to turn the FET on again.

10. A method according to claim 9 further comprising determining from the value of the parameter whether the temperature of the FET is above a predetermined target value, then controlling the gate of the turned off FET to keep the FET switched off until the temperature reduces to the predetermined target value.

11. A method according to claim 9 wherein a plurality of FETs are arranged in parallel to drive a circuit load connected between source and drain, each FET having a temperature sensing diode connected between the gate and source, the diode cathode connected to the gate of the FET and the diode anode connected to the source of the FET, wherein controlling the gate of the FET includes switching off the FET gates alternately.

* * * * *